United States Patent [19]

McCullion, Jr.

[11] 4,325,631

[45] Apr. 20, 1982

[54] METHOD OF COLOR PRINTING

[75] Inventor: Francis E. McCullion, Jr., Colts Neck, N.J.

[73] Assignee: Cymaticolor Corporation, Edison, N.J.

[21] Appl. No.: 204,959

[22] Filed: Nov. 7, 1980

[51] Int. Cl.³ .............................................. G03B 27/32
[52] U.S. Cl. ........................................ 355/77; 355/32; 355/35; 355/85; 355/132
[58] Field of Search ..................... 355/132, 88, 85, 77, 355/37, 35, 32, 71, 19; 358/302; 101/177, 174

[56] References Cited

U.S. PATENT DOCUMENTS

| | | | |
|---|---|---|---|
| 2,663,254 | 12/1953 | Parrish | 101/174 |
| 2,663,255 | 12/1953 | Parrish | 101/174 |
| 3,000,737 | 9/1961 | Barnhart | 355/32 X |
| 3,288,925 | 11/1966 | Moe | 355/32 X |
| 3,627,908 | 12/1971 | Dailey | 355/32 X |
| 3,744,415 | 7/1973 | Ras | 101/177 |
| 3,951,668 | 4/1976 | Schumacher et al. | 106/20 |

OTHER PUBLICATIONS

"Graphic Arts Manual," vol. 2, (Photolithography), by H. N. Cartwright, (Ilford Limited, Ilford, Essex, England, ca. 1970, pp. 35-49).

Primary Examiner—Richard A. Wintercorn
Attorney, Agent, or Firm—Gottlieb, Rackman & Reisman

[57] ABSTRACT

A method of providing full range color printing using duplicator technology is disclosed. The system utilizes subtractive color printing techniques, but avoids the necessity for color masking and generally eliminates color correction as well. Following exposure of multiple negatives to develop color separations, corresponding printing plates are prepared and developed. A proofing sequence is optional between the development of the negatives and the plates. The ultimate printing is achieved by feeding stock into a duplicator which carries each of the three basic negative complementary colors, in sequence; a "black" printer can also be used for a higher degree of contrast and tone.

11 Claims, 3 Drawing Figures

METHOD OF COLOR PRINTING

This invention relates to printing techniques in general, and to obtaining quality color reproductions using simplified duplicator methods in particular.

The printing industry has reached high levels of sophistication over the past several years as many businesses and other fields have placed increasingly greater demands on the quality of their printed material. From its early beginnings in straightforward black-and-white reproduction, printing has followed a gradual development in terms of techniques, quality and output which has led to current achievements in each phase of the industry.

From the start, users of printed materials have covered a wide range of interests and fields. In the general field of "business," virtually every commercial entity which has a product to display relies on print media either to illustrate their product line, in advertising or for internal instruction to employees and other personnel. Similarly, the educational field has come to rely on printing to a greater and greater extent, especially insofar as utilizing brochures and supporting materials, rather than comprehensive textbooks, is concerned. Even the average consumer has begun to realize that the proliferation of printed materials makes it possible for him to utilize such materials to his advantage, whether in small business ventures or in personal matters requiring visual or graphic displays.

This expansion of printing and related techniques has had perhaps one major and overriding emphasis—the need and desire for color reproduction. Certainly, all those who have developed legitimate uses for print media in general have become prime candidates for the use of color printing. In business and advertising in particular, the clamor for quality color printing has grown at a meteoric rate, and has placed demands on the printing industry that have not always been met.

One of the main problems in satisfying this growing demand has been the inability of the industry to provide both high quality color printing and reasonable cost to the users. Many of the potential customers for color printing have been unwilling or indeed unable to obtain their desired product at competitive prices. This is attributable to the types of color printing that have generally been available heretofore. For example, multi-color printing presses or even offset presses have been available to achieve satisfactory color printing, but in a relatively complicated system and at high cost. Such systems make use of complex multiple position roller arrangements for the different color impressions known to be required in color printing. But because of the extensive mechanical linkages, feeding systems and registration requirements, as well as the need to correct the colors during the process, cost is a necessarily high component in producing the type of quality product which only some purchasers are able to afford. Nevertheless, there are numerous others who not only cannot tolerate the great expense of conventional color printing techniques, but who may also not require the absolutely "perfect" color quality which such techniques are capable of achieving. In fact, many users would be only too glad to accept virtually undetectable color differences in the printed product in exchange for reduced costs and simplified operation. Among such users could be small businesses which must still advertise extensively; companies seeking to move from monochromatic materials into color, but who are limited by the anticipated expenses; businesses which have always used color effectively, but whose work product does not demand the precise type of color reproduction which has been the only kind available to them until now; and individuals who would like to use color print media for an infinite variety of very personal uses, but for whom the cost has been a prohibitive factor.

It is therefore an object of the present invention to obviate one or more of the aforesaid difficulties.

It is also an object of this invention to provide a method of color print reproduction which eliminates color masking and correction and utilizes a duplicator-generated final product.

It is a further object of this invention to utilize duplicator technology to generate acceptable levels of color reproduction for a wide variety of applications.

These and other objects and advantages of the invention will become apparent when a particular illustrative embodiment thereof is considered, wherein quality color reproductions are generated using a duplicator operating as a sophisticated offset press, but without the traditionally expensive and slow color masking steps. In this illustrative embodiment of the invention, the particular object to be reproduced, such as line copy, artwork, half-tones or the like, is placed in an appropriate holder on a copyboard and affixed with appropriate registration indices as is well known—this is to permit the ultimate registration of acetate elements in a proofing step and printing plates for the ultimate duplicating step. The artwork is illuminated from at least two remotely spaced sources of intensive light and as the light reflects from the object, it is collected in an appropriate light channeling collar or similar member mounted in front of a camera focusing system. At this focusing stage of the process, light passes through a lens and is focused on a ground glass element, so that the focusing step can be completed to the operator's satisfaction by noting the clarity of the image on the element.

Once the focusing step has been completed, the ground glass element is no longer required and, for the particular color negative to be exposed, a film holder with a graphically sensitive panchromatic film for all of the principal complementary negative colors replaces the ground glass element. For example, assuming a three-color process without a "black" printer, the negatives will represent the cyan, magenta and yellow negative colors. In order to achieve visual clarity and sufficient definition of the ultimate image, a pre-angled dot screen is arrayed in front of the film holder and an appropriate filter, dependent upon the particular negative color being exposed, is introduced into the forward collar of the camera focusing system.

Each filter selected during the respective exposure step is chosen because of its ability to allow only the complementary color for that step to pass through to the dot screen and then to the film member now held in place where the ground glass element had been. For example, a red filter is used to prepare a "minus red" negative, which will ultimately generate the blue printing plate. A blue filter is used to prepare a "minus blue" negative which will ultimately generate the yellow printing plate. Similarly, the green filter is placed into the collar to prepare a "minus green" negative which will be utilized for the preparation of the red printing plate.

In each exposure step, the film member at the rear of the camera is developed for a prescribed time period and appropriate masking sheets for the three colors involved are aligned using well-known tab and registration indices. At this point, there may be introduced a "proofing" step, which determines the precise color quality of each negative. If this step is desired, it involves mounting each negative on a color key sheet and actually preparing a separate color keyed member for each of the three color steps. Thereafter, the key sheets are mounted in layers and registered with respect to each other, and the relative color content of the composite product is tested. Should any color revision be necessary, it can be done at this point.

For each of the three negatives, a suitable plate, which is known in subtractive printing technology, is prepared. This involves the exposure of the plate through the negative, such that the exposing light removes or "burns" away all of the plate's surface except where the negative image is located, and that material remains for the ultimate contact printing step. These exposure steps occur in sequence, followed by appropriate developing and finishing of the plates.

Each plate is then successively inserted into a duplicator and printed with appropriate color ink. As will be described in detail hereinafter, the duplicator operates by transferring an inked image from the plate cylinder to the blanket cylinder and ultimately to the sheet stock fed into the duplicator, which is urged into the blanket cylinder by means of the impression cylinder. In preparing the final printing stock, the "minus red" plate, developed from the negative lacking in red color, is printed in the duplicator with cyan ink; this negative contains cyan and any of the other basic colors containing cyan. When that step is completed, the first plate is removed and the "minus blue" plate is mounted on the plate cylinder and the ink supply of the duplicator is replaced with yellow ink, thus providing all of the other basic colors containing yellow. Finally, the third and last plate is the "minus green" plate, which is utilized with magenta colored ink to provide all of the other basic colors containing magenta, thus completing the color reproduction of the original. While absolutely "perfect" color may not necessarily be achieved with these three colors and the dot screen technique accompanying this system, the results are, in most cases, virtually indistinguishable from perfect color reproduction and, in any event, are more than satisfactory for the particular purposes involved. In addition, a fourth filter and exposure step, using a yellow filter to prepare a "black" negative (which does not contain any of the substractive colors) and ultimately a corresponding plate, can also be used to give greater detail and contrast to the final product.

This system therefore involves the generation of high quality color reproduction using a duplicator to reproduce photographic copy rather than the complicated full color presses which have heretofore been available and indeed have been felt to be virtually a prerequisite for adequate color reproduction.

It is therefore a feature of an embodiment of this invention that color separation negatives generate color plates which are sequentially mounted in a duplicator for color reproduction.

It is another feature of an embodiment of this invention that color printing plates for a duplicator are prepared without color matching or correction.

It is a further feature of an embodiment of this invention that an intermediate proofing step can be utilized to verify the color content of the color negatives before preparing the color plates.

Additional objects, features and advantages of this invention will become more readily understood when considered in connection with a presently preferred, but nonetheless illustrative, embodiment of the invention that is explained in the following detailed description and as shown in the accompanying drawing wherein.

Figure 1:
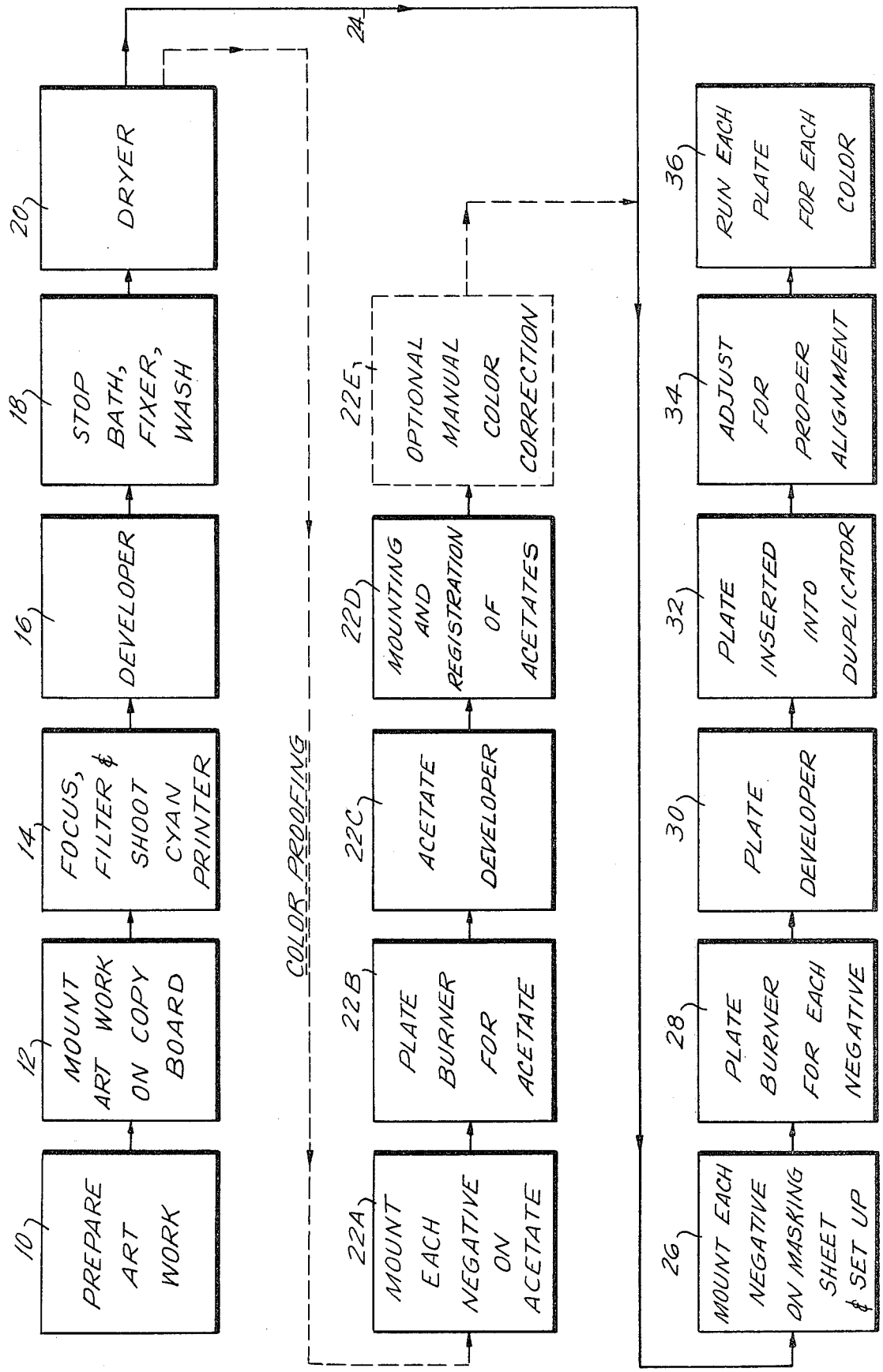
FIG. 1 is a block diagram representing a flow chart showing the sequence of operation of the printing method of this invention.

Initially referring to the block diagram of FIG. 1, the first step indicated by block 10 is to prepare the appropriate artwork. Such artwork may be in the form of line copy, half-tones, photographs or the like, and it is at this point that the system operator can initially determine whether it will be desirable or necessary, either for clarity or for a customer's needs, to use the "black" printer to give greater detail, richness or color clarity. But regardless of whether a black printer is used, the basic inventive steps herein described remain the same. Following the preparation of the artwork at block 10, the artwork is mounted on the copyboard. This step, indicated at block 12 in FIG. 1, will be described in some further detail with respect to the physical components of the copyboard setup in connection with FIG. 2 hereinafter.

As shown in block 14, the artwork on the copyboard is presented to the camera focusing system and focusing takes place with respect to the mounted artwork without regard for which color is to be photographed thereafter. In other words, the lens system is focused on the artwork which is being illuminated, and then an appropriate color filter is placed into the light collector portion of the camera assembly. Assuming that it is the cyan step which occurs first in the exposure process, that filter absorbs all red light from the subject artwork and passes the blue and green components in a subtractive color system as is being disclosed here. In order to expose the cyan printing film, the ground glass element which acted as the receiving surface for the focusing step is removed and is replaced by a film holder behind a dot screen. The screen is of the pre-angled, grey contact type, while a suitable film for use with this invention is Kodak Graphic Arts Film, No. 2568.

Since the focusing has already been achieved by virtue of the placement of the ground glass element, no further focusing is required. The exposure step then occurs for the cyan part of the process and with a red filter present between the reflected light from the artwork and the focusing system and the film. Depending upon the situation, varying light intensities and lens openings can be used, as well as corresponding exposure times. In the case of a red filter for the cyan step consisting of a Kodak No. 25 filter, a light intensity of 64,000 foot candles is present at the lens and an opening of f/22 can be used. An appropriate exposure time for this step can be 50 seconds. When a blue filter (e.g., Kodak No. 47) is used for the yellow printing step, the exposure time may illustratively be 60 seconds. And when a green filter (e.g., Kodak No. 58) is used to prepare the red printing plate, an exposure time of 70 seconds may be used. In the event that a black printer is utilized, a yellow filter (e.g., Kodak No. 8) is employed with a 25 second exposure time.

Following each of the separate exposure steps, the film is developed in a high quality developer such as Naccolith 611, with the operator carefully monitoring the gradually darkening Stouffer scale. Again, depending upon the desired output, varying darkening stages can be accepted; one appropriate result occurs when the No. 1 dot on the Stouffer scale becomes solid black. This is a useful guide to evaluate the exposure time for the system in each of the exposure steps. The developing step at block 16 in FIG. 1 represents each of the developing processes for the various colors involved. In order to complete the processing of each negative, the steps indicated in block 18 take place whereby developing is terminated by a stop bath, and the negative is then fixed and washed in normal photographic fashion, followed by the drying step indicated at block 20.

In certain color reproduction, it will prove to be desirable to effect a proofing step, whereby the particular color content of the three (or four) negatives which have been prepared up until this point can be verified. In other situations, for example, where "pure" cyan, yellow and magenta colors are being reproduced without intermingling and with no possibility of color distortion, the proofing will not be necessary. But assuming that it is necessary or desirable for a particular customer's needs, this process permits proofing to occur at 22 in FIG. 1. The series of blocks indicated at 22A–22E constitute the proofing steps.

The proofing process commences when the negatives from the first group of steps have been completely prepared and dried. Referring to one negative at a time, block 22A indicates that the negative is mounted over a particular color sensitive key sheet, such as an acetate member in a vacuum-held frame to keep it in place with respect to the negative. An intense illuminating source is then provided to expose the acetate through the blank regions of the negative—this is the same "burning" step which will ultimately prepare the corresponding printing plate and is indicated at step 22B. Each of the separate acetate members prepared in this manner is then passed through a developer solution for the acetate itself. This causes the negative regions on the acetate which have been highlighted by the previously described exposure step to be developed and emphasized and each of the three or four acetates exhibiting its corresponding color hues is then complete.

Using the original registration indices which were placed on the artwork at the time of initial shooting, the respective acetates are themselves aligned on a mounting board at the step indicated at block 22D. By aligning the three or four acetates, each of the separate color contents of the acetates can be evaluated and by overlaying all of them together, a reasonably good "prediction" of the ultimate color content of the finished product can be ascertained. If the color of the composite work is suitable in comparison to the original artwork shown in block 10, then nothing further need be done and the system moves on to the preparation of the color printing plates. If, on the other hand, the particular color hues are such that some slight departure from the norm beyond that which is acceptable to the operator has resulted, the optional color correction indicated by the block 22E enclosed in dashed lines in FIG. 1 can proceed. Such color correction is often necessary when color separating pastels, water colors, line color or other similar color copy. The corrective action to be taken is either under-exposing or over-exposing the film to obtain a negative containing the appropriate proportions of color hues desired.

Whether there has been color correction to the negatives or not, the next step is indicated by the passage from drying block 20 (or from blocks 22D or 22E), directly into path 24 which leads to the first step in the preparation of the printing plates. That step, indicated at block 26, involves the mounting of each negative in succession on a masking sheet, such as conventional square graph paper, and registering the negatives with well-known tabs and registration pins. In order to prepare each plate, the negatives are then mounted over an appropriate size printing plate, with the composite arrangement being inserted into a vacuum frame. With the negative and plate held together by means of a vacuum, the plate is exposed to a high intensity light source until properly exposed for the particular arc light or "burner" being used. This exposes the plate and removes the plate material except where the negative image has been located. This results, for example, in the preparation of the cyan printing plate where the "minus red" negative has been used. Similarly, the other two or three plates are prepared in a comparable fashion.

Following this "burning" step, each plate is separately developed by an appropriate plate developer well-known in the photographic arts. Thereafter the plate is removed from the developer, cleaned and dried. Each plate, after having had these steps performed on it, is now ready for insertion onto the duplicator.

Figure 3:
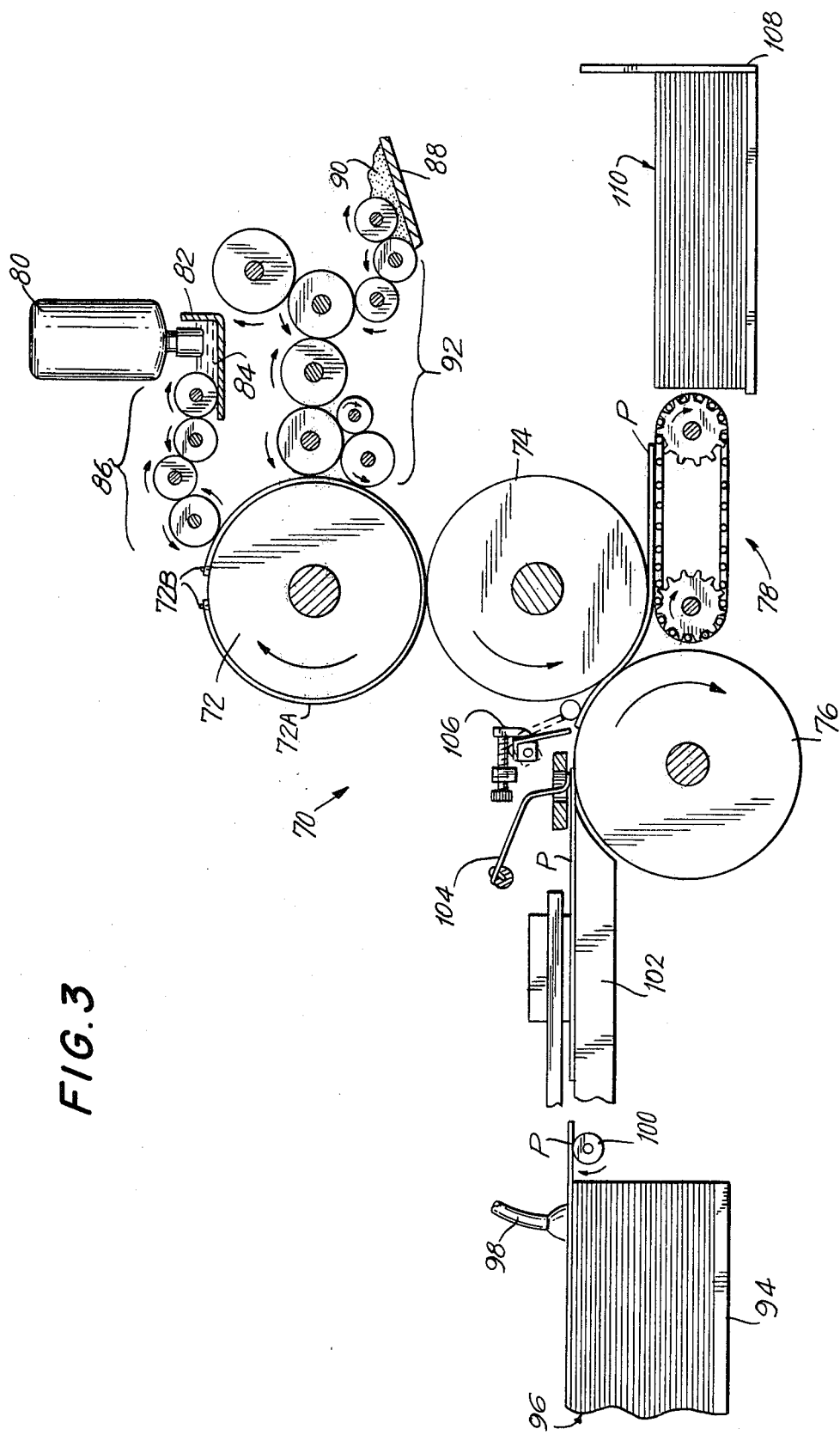
FIG. 3 is a simplified schematic diagram of the duplicator utilized in this invention.

As shown at block 32, each plate is sequentially mounted on the duplicator plate cylinder and, as will be described in connection with FIG. 3, is held in place by appropriate registration pins. A test sheet may be run to determine whether the paper fed in is properly aligned with respect to each particular printing plate. Adjustments (block 34) may be necessary from plate run to plate run. Assuming that each adjustment had been appropriately made, block 36 now comes into play, running each of the plates for the corresponding color. When subtractive colors are being used as this description has assumed, the "minus red" plate, which was prepared from the negative exposed through a red filter, is printed with cyan ink. The plate prepared from the negative exposed through the green filter is printed with magenta ink. And the plate prepared from the negative exposed to light through a blue filter is printed with yellow ink. (In the event that a fourth negative is desired, a yellow filter such as Kodak No. 8 may be used at step 14, with an exposure time of 25 seconds. The development on the Stouffer scale for this "black" printer is at number 5 and the ultimate printing step at block 36 utilizes black ink for the desired contrast and intensity.)

As a result of the foregoing steps, when the full registration of the complementary colors has been achieved, three- or four-color printing has been obtained by means of a duplicator but without the need for a three- or four-color press. Resultant cost savings and ease of operation are apparent results through the use of this invention.

Figure 2:
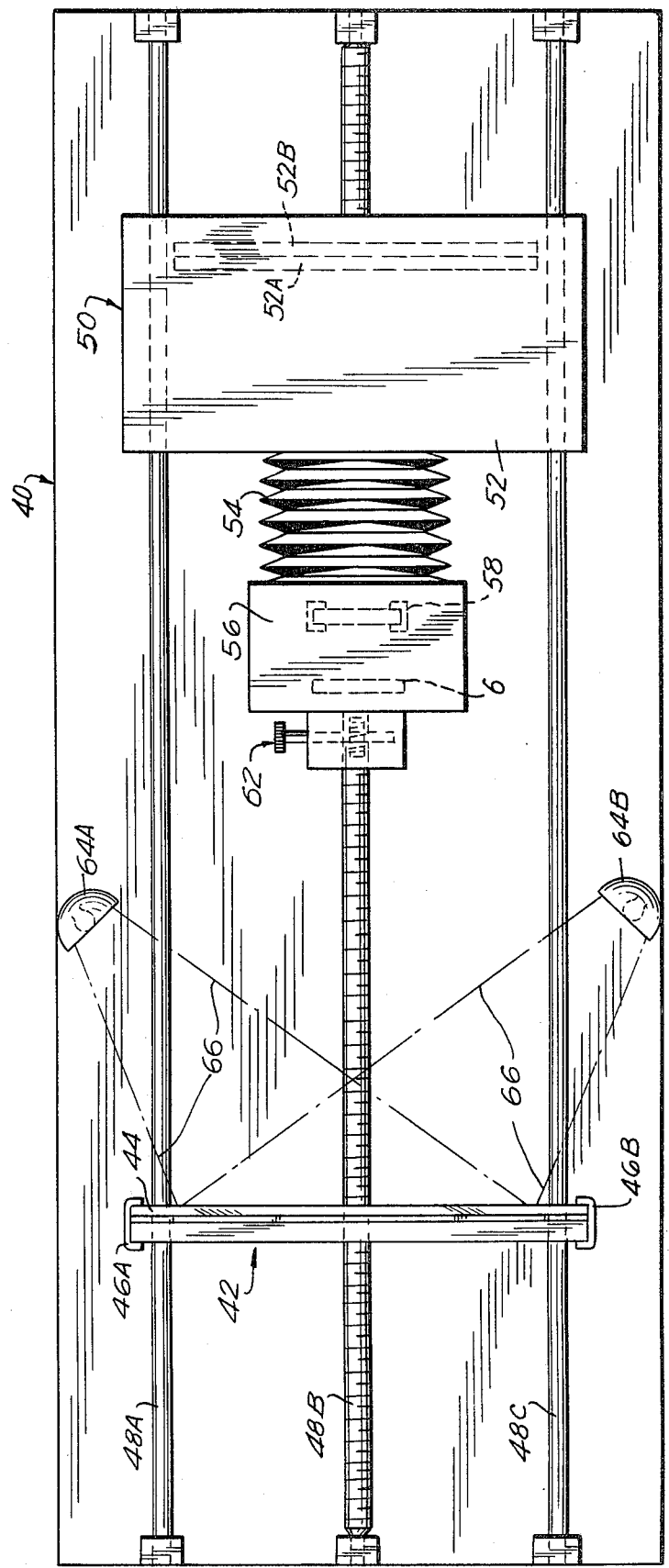
FIG. 2 is a top plan view of the copyboard arrangement showing artwork being illuminated for exposure during the process.

Considering the illustration of FIG. 2, the copyboard setup which was described at blocks 12 and 14 of FIG. 1 is shown in greater detail. The overall board arrangement 40 utilizes a pivotable mounting board 42 on which artwork 44 may be mounted within brackets 46A and 46B. After the artwork has been mounted in this structure, and before illumination is applied, focusing of camera assembly 50 is effected. Camera 50 as well as board 42 is transportable along rails 48A, 48B and 48C, in order to achieve appropriate focusing and positioning.

Following the mounting of the artwork 44 as indicated, focusing is achieved by manipulating enclosure 56 which moves with respect to main camera body 52 through expandable bellows 54. In the initial focusing step described at block 14 in FIG. 1, a ground glass element (not shown in FIG. 2) is present where film member 52B is shown. Focusing is achieved by the use of lens 60 which passes the image of artwork 44 through the lens chamber 56 and past filter holder 58 to the screen at the rear of camera chamber 52. When focusing is completed by manipulation of thumb screw 62 and ancillary movement of the camera elements, the appropriate filter is placed into holder 58. As has been previously mentioned, where the cyan step is first, a red filter is used to prepare the "minus red" negative.

At this point, the screen which was used for focusing purposes is replaced by film member 52B and a dot screen is placed in contact with the film to create the half-tone image. Screen 52A will vary for each exposure step, and will generally consist of an array of elliptical dots, with a density of 133 to 150 dots per square inch. Each separate dot screen is pre-angled, with the cyan screen angle being 105°, the yellow dot screen angle being 90° and the magenta dot screen angle being 75°. (If a black printer step is used, its separate dot screen angle will be 45°.)

High intensity lamps 64A and 64B are then lit and provide the necessary intensive illumination 66 to the artwork 44, which then reflects light through lens 60, filter 58 and past dot screen 52A to film member 52B. The "minus red" negative is thereby prepared in the cyan step. The "minus blue" and "minus green" negatives are similarly prepared utilizing blue and green filters respectively. Should a "black" printing step be considered necessary or desirable, a yellow filter is placed into filter holder 58 and the black ("minus yellow") negative is prepared.

The exposure of the three or four negatives is an important aspect of the process of this invention and, as indicated in FIG. 2, is done with some precision in order to generate appropriate negative images, since these images will be utilized to prepare the ultimate printing plates. However, if done properly in accordance with the principles of this invention, the colors will be accurate and appropriate for use in the duplicator adapted to be used in this invention without the necessity to utilize a multi-color printing press.

Referring to FIG. 3 of the drawing, the duplicator 70 consists of a system for feeding sheet stock through a plurality of interconnected rollers to apply to the stock an impression corresponding to one of the three or four colors being utilized in the printing process. Water and ink are supplied to the plate and are then transferred by contact with other associated rollers or cylinders to eventually come into contact with the printing stock for the application of the particular color portion of the image.

The main operative roller of the duplicator is plate cylinder 72, around which plate 72A is mounted by means of registration pins 72B. Each of the plates, after having been exposed and developed in the steps designated at 28 and 30 in FIG. 1, is then affixed in sequence around plate cylinder 72. Thereafter, the image which is present on plate 72A is appropriately supplied with water and ink, as will be described hereinbelow, and the resultant image is transferred by rotational contact with blanket cylinder 74. The image is ultimately applied to sheet stock P from the blanket cylinder 74 by virtue of the pressing contact effected between blanket cylinder 74 and impression cylinder 76, as stock P passes between those two cylinders. The stock P is then drawn out from between these two latter cylinders by means of a chain gripping arrangement indicated at 78.

In reviewing the overall operation of the duplicator, there is an infeed hopper 94 which carries a supply of suitable sheet stock designated 96. A suction feeding arrangement at 98 draws in each individual sheet P, which is introduced into the system by the rotational forward movement supplied by roller 100. The individual sheet P travels over platform 102 and arrives at stop mechanism 104, just before it is transferred to the moving control of impression cylinder 76. Front guide adjustments 106 are used by the operator to align the individual sheet stock element in such a manner as to apply the image to the stock at the appropriate location. This may be somewhat arbitrary with respect to the first color to be printed, but becomes increasingly important as more than a single color has been applied to the stock. Thus, after the first color has been applied and a second color is in process, strict alignment and registration are necessary, and the same is true for the third or possibly a fourth color as well.

The water and ink supplies are indicated in FIG. 3 at 80 and 90 respectively. The water supply consists of an inverted bottle arrangement 80, mounted in a trough 82, providing a regular supply 84 of water to the feeding rollers generally designated 86. The leftmost one of rollers 86 is in actual contact with plate 72A wrapped around and mounted on plate cylinder 72. It is noted that as plate cylinder 72 rotates in a clockwise direction, the plate member 72A first comes into contact with the water supply 84 from inverted bottle 80. Plate 72A has, by virtue of the preparation and development thereof, had its printing portion thereof (i.e., the image) made receptive to grease or oil and repellent to water; conversely, the non-image portions of the plate are receptive to water and reject the ink. As the plate cylinder rotates, its first contact with the leftmost one of water supply cylinders 86 applies a water solution which "takes" to the areas on plate 72A which are not designed to print, i.e., the non-image regions. As it continues its clockwise rotation, the plate then comes into contact with the inking rollers.

The inking system includes an ink supply 90 within a supply trough 88, as well as a series of rollers indicated at 92 which cause ink to be made available to plate 72A during the rotational process. However, by the time any portion of plate 72A has arrived at the inking area of rollers 92, it has already received its water solution as indicated above. Accordingly, the water on the non-image portion of the plate prevents the ink 90 from being applied thereto. On the other hand, the ink does hold on the image portions of plate 72A on which virtually no water has remained. This permits the image portion to be well supplied with ink in the appropriate areas, thus resulting in a transfer of an inked image to blanket cylinder 74. In the areas where no image is desired, the blanket cylinder reflects an absence of transferred ink.

The sheet stock P receives its individual color image by contact with blanket cylinder 74 under the influence of pressing impression cylinder 76. It is then removed from the system by chain gripper arrangement 78, which places each sheet of finished stock P in a stacking hopper 108, forming a stack of finished work 110. Each successive color is printed in sequence, for example the cyan, yellow and magenta colors referred to in this application which are the appropriate ones for printing in a subtractive color system. The use of the duplicator 70 of FIG. 3 therefore creates the possibility of using a duplicator's technology to achieve full color printing with more than adequate results for numerous applications.

It is to be understood that the above described embodiments are merely illustrative of the application of the principles of this invention. Numerous variations may be devised by those skilled in the art without departing from the spirit or scope of the invention.

What is claimed is:

1. A method of reproducing on stock a color original having multiple basic color components, including the steps of mounting said original on a movable surface, focusing a lens system on said original, inserting a selected filter into said lens system for allowing the transmission therethrough of respective subtractive colors in said original, inserting a film member into said lens system for each of said basic color components, exposing each said film member through a respective one of said filters, preparing a film negative for each of said subtractive colors and corresponding to each said exposure, mounting each said negative in conjunction with a corresponding plate member, exposing said plate member to light through each corresponding negative to selectively prepare said plate member for reproduction of a component image portion of said original, sequentially inserting each said plate member into a duplicator machine, applying water and correspondingly colored ink to the plate cylinder of said duplicator with each said respective plate member inserted therein, operating said duplicator to apply respective color components of said original to said stock in sequence and collecting said stock after said reproduction has been completed.

2. A method in accordance with claim 1 wherein said basic color components in said original include cyan, yellow and magenta, said filter inserting step includes selecting a first filter to transmit all colors of said original other than red, a second filter to transmit all colors of said original other than blue and a third filter to transmit all colors of said original other than green, said film exposing step includes preparing each said negative corresponding to the use of said first, second and third filters, said plate preparation step includes development of each said plate member corresponding to said negatives prepared in accordance with each of said first, second and third filters, and said ink applying step in said duplicator includes supplying cyan ink for said plate member corresponding to said first filter, supplying yellow ink for said plate member corresponding to said second filter and supplying magenta ink for said plate member corresponding to said third filter.

3. A method in accordance with claim 2 wherein said filter inserting step further includes selecting a fourth filter to transmit all colors of said original other than red, blue and green, said film exposing step includes preparing one of said negatives corresponding to the use of said fourth filter, said plate preparation step includes development of one of said plate members corresponding to said negative prepared in accordance with said fourth filter, and said ink applying step in said duplicator includes supplying black ink for said plate member corresponding to said fourth filter.

4. A method in accordance with claim 3 wherein said first filter is red, said second filter is blue, said third filter is green and said fourth filter is yellow.

5. A method in accordance with claim 1 including the additional steps, subsequent to said negative preparation step, of proofing said negatives by sequentially mounting each of said negatives on respective color key members, exposing each of said color key members through its corresponding one of said negatives, developing each of said color key members to display the corresponding color portion of said original, mounting each of said color key members in overlying registration relative to each other, evaluating the color content of said overlying color key members and incorporating any necessary color corrections into said negatives.

6. A method in accordance with claim 5 wherein said incorporating step includes selectively overexposing or underexposing said negatives.

7. A method in accordance with claim 1 wherein said movable surface includes a pivotable copyboard, and said focusing step includes placing a ground glass element for focusing purposes to receive the focused image of said original thereon, and including the additional step of removing said ground glass element subsequent to said focusing step and prior to said exposing step and replacing said ground glass element with a halftone screen between said filter and said film member.

8. A method in accordance with claim 7 wherein said halftone screen is of the elliptical dot type, having a density of between 133 and 150 dots per square inch.

9. A method in accordance with claim 8 wherein said halftone screen is pre-angled for each said exposing step, said screen corresponding to the transmission of all colors of said original other than red being angled at 105°, said screen corresponding to the transmission of all colors of said original other than blue being angled at 90° and said screen corresponding to the transmission of all colors of said original other than green being angled at 75°.

10. A method in accordance with claim 9 wherein said halftone screen for said exposing step corresponding to the transmission of all colors of said original other than red, blue and green is angled at 45°.

11. A method in accordance with claim 1 wherein said film member is of the panchromatic type.

* * * * *